United States Patent
Jang et al.

(10) Patent No.: US 10,734,424 B2
(45) Date of Patent: Aug. 4, 2020

(54) IMAGE SENSING DEVICE

(71) Applicant: SK hynix Inc., Icheon-si (KR)

(72) Inventors: Cheol-Jon Jang, Seongnam-si (KR);
Tae-Chan Kim, Yongin-si (KR);
Chang-Hee Pyeoun, Seoul (KR);
Su-Min Kim, Namyangju-si (KR);
Seong-Hee Park, Yongin-si (KR);
Jong-Heon Kim, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 108 days.

(21) Appl. No.: 16/154,524

(22) Filed: Oct. 8, 2018

(65) Prior Publication Data

US 2019/0259795 A1 Aug. 22, 2019

(30) Foreign Application Priority Data

Feb. 21, 2018 (KR) .................. 10-2018-0020781

(51) Int. Cl.
| | | |
|---|---|---|
| *H01L 31/062* | (2012.01) | |
| *H01L 27/146* | (2006.01) | |
| *H04N 5/357* | (2011.01) | |
| *H04N 5/341* | (2011.01) | |

(52) U.S. Cl.
CPC .. *H01L 27/14621* (2013.01); *H01L 27/14605* (2013.01); *H04N 5/341* (2013.01); *H04N 5/357* (2013.01)

(58) Field of Classification Search
None
See application file for complete search history.

(56) References Cited

U.S. PATENT DOCUMENTS

| | | | |
|---|---|---|---|
| 9,455,285 B2* | 9/2016 | Keelan | H01L 27/14605 |
| 10,249,657 B2* | 4/2019 | Tashiro | H01L 27/146 |
| 2016/0269662 A1* | 9/2016 | Hepper | H04N 5/3696 |
| 2018/0061878 A1* | 3/2018 | Nomura | H04N 5/37457 |

FOREIGN PATENT DOCUMENTS

| | | |
|---|---|---|
| KR | 10-1332689 | 11/2013 |
| KR | 10-2014-0117242 | 10/2014 |

\* cited by examiner

*Primary Examiner* — Hung K Vu
(74) *Attorney, Agent, or Firm* — Perkins Coie LLP

(57) ABSTRACT

An image sensing device includes an image sensor including a first sub-pixel array and a second sub-pixel array. The first sub-pixel array includes a plurality of first pixels having a first color filter, and the second sub-pixel array includes a plurality of second pixels having a second color filter and a plurality of third pixels for phase detection. The image sensor may generate first pixel values from the first pixels, second pixel values from the second pixels and third pixel values from the third pixels. The image sensing device also includes an image processor suitable for generating a first image value corresponding to the first sub-pixel array based on the first pixel values and generating a second image value corresponding to the second sub-pixel array based on the first to third pixel values.

17 Claims, 3 Drawing Sheets

FIG. 4

| B0 | B0 | G0 | G0 | B1 | B1 | G1 | G1 |
|----|----|----|----|----|----|----|----|
| B0 | B0 | G0 | G0 | B1 | B1 | G1 | G1 |
| G0 | G0 | R0 | R0 | G1 | G1 | R1 | R1 |
| G0 | G0 | R0 | R0 | G1 | G1 | R1 | R1 |
| B2 | B2 | G2 | G2 | B3 | B3 | G3 | G3 |
| B2 | B2 | G2 | G2 | LPD | RPD | G3 | G3 |
| G2 | G2 | R2 | R2 | G3 | G3 | R3 | R3 |
| G2 | G2 | R2 | R2 | G3 | G3 | R3 | R3 |

↓ 4-sum

| B00 | G01 | B02 | G03 |
|-----|-----|-----|-----|
| G10 | R11 | G12 | R13 |
| B20 | G21 | X   | G23 |
| G30 | R31 | G32 | R33 |

↓ correction

| B00 | G01 | B02 | G03 |
|-----|-----|-----|-----|
| G10 | R11 | G12 | R13 |
| B20 | G21 | B22 | G23 |
| G30 | R31 | G32 | R33 |

United States Patent US 10,734,424 B2

IMAGE SENSING DEVICE

CROSS-REFERENCE TO RELATED APPLICATIONS

This patent document claims the priority and benefits of Korean Patent Application No. 10-2018-0020781, filed on Feb. 21, 2018, in the Korean Intellectual Property Office, the disclosure of which is incorporated herein by reference in its entirety.

TECHNICAL FIELD

The technology and implementations disclosed in this patent document relate generally to a semiconductor device and an integrated circuit including an image sensing device.

BACKGROUND

An image sensing device is a sensor that captures images using photosensitive properties of semiconductors. Image sensing devices are often classified into charge-coupled device (CCD) image sensors and complementary metal-oxide semiconductor (CMOS) image sensors. CMOS image sensors are fabricated based on CMOS integrated circuit fabrication process. This feature of CMOS image sensors makes it possible to integrate both analog and digital control circuits in a single integrated circuit (IC), making CMOS image sensors the most widely used type of image sensor.

SUMMARY

This patent document provides, among others, designs of an image sensing device that may compensate for a pixel value generated from a phase detection pixel when an image is processed in a structure in which an image pixel and the phase detection pixel are mixed.

In one example aspect, the disclosed technology can be implemented to provide an image sensing device that includes: an image sensor including a first sub-pixel array and a second sub-pixel array, the first sub-pixel array including a plurality of first pixels each converting light into a pixel signal and including a first color filter to allow light of a first color to be received by each first pixel, the second sub-pixel array including both (1) a plurality of second pixels each converting light into a pixel signal and including a second, different color filter to allow light of a second color to be received by each second pixel, and (2) a plurality of third pixels that captures light for phase detection to provide image phase information, the image sensor generating first pixel values from the first pixels, second pixel values from the second pixels, and third pixel values from the third pixels; and an image processor coupled to receive pixel signals from the imager sensor and structured to process the received pixel signals to generate a first image value corresponding to the first sub-pixel array based on the first pixel values and a second image value corresponding to the second sub-pixel array based on the first to third pixel values.

The first image value may be generated by combining the first pixel values, and the second image value may be generated by removing fourth pixel values estimated based on the first pixel values to represent the third pixel values, from an image value obtained by combining the second pixel values and the third pixel values.

In another example aspect, the disclosed technology can be implemented to provide an image sensing device that includes: an image sensor including a first unit pixel array and a second unit pixel array of pixel units having only image pixels that sense incident light to generate imaging signals representing an image and a third unit pixel array of pixel units having both image pixels that sense incident light to generate imaging signals representing the image and phase detection pixels that sense incident light to detect phase information of the image, and suitable for generating first pixel values from the first unit pixel array, second pixel values from the second unit pixel array, and third pixel values from the third unit pixel array; and an image processor coupled to receive pixel signals from the imager sensor and structured to process the received pixel signals to generate (1) first image values corresponding to the first unit pixel array based on the first pixel values, (2) second image values corresponding to the second unit pixel array based on the second pixel values, and (3) third image values corresponding to the third unit pixel array based on some of the first pixel values, some of the second pixel values, and the third pixel values, wherein each of the first and second unit pixel array includes image pixels that arranged in a first color pattern that renders each image pixel to detect light of a first color, and the third unit pixel array includes image pixels and phase detection pixels arranged in a second color pattern that renders each image pixel to detect light of a second, different color.

The image processor may include: a combination block coupled and structured to combine the first to third pixel values from the pixel unit to generate the first to third image values; an extraction block coupled to the combination block and structured to extract some of the first image values, some of the second image values, and the third image values; a correction block coupled to the extraction block and structured to generate a correction value based on some of the first image values, some of the second image values and some of the third image values to compensate for the pixel values of the phase detection pixels in a target value obtained from the third image values; and an image processing block coupled to the combination block and the correction block and structured to replace the target value with the correction value.

In another example aspect, the disclosed technology can be implemented to provide an image sensing device that includes: a fifth sub-pixel array including one or more fifth image pixels having a second color filter and one or more phase detection pixels; a first sub-pixel array disposed adjacent to a top portion of the fifth sub-pixel array and including first image pixels, each having a first color filter; a second sub-pixel array disposed adjacent to a bottom portion of the fifth sub-pixel array and including second image pixels, each having the first color filter; a third sub-pixel array disposed adjacent to a left of the fifth sub-pixel array and including third image pixels, each having the first color filter; a fourth sub-pixel array disposed adjacent to a right of the fifth sub-pixel array and including fourth image pixels, each having the first color filter; and an image processor coupled to receive signals from the first, the second, the third, the fourth and the fifth sub-pixel arrays and structured to generate (1) a first image value based on first pixel values generated from the first sub-pixel array, (2) a second image value based on second pixel values generated from the second sub-pixel array, (3) a third image value based on third pixel values generated from the third sub-pixel array, (4) a fourth image value based on fourth pixel values generated from the fourth sub-pixel array, and (5) a fifth image value based on the first to fourth image values and fifth pixel values generated from the fifth sub-pixel array.

Each of the phase detection pixels may have the first color filter.

The first color filter may include a green color filter, and the second color filter may include a blue color filter or a red color filter.

In another example aspect, the disclosed technology can be implemented to provide an image sensing device that includes: a pixel array including a plurality of image sub-pixel arrays each including (1) only image pixels that sense incident light to generate imaging signals representing an image and (2) a common color filter at each pixel for transmitting light only at a designated color to be received at the pixel, and a plurality of mixed sub-pixel arrays each including both image pixels and phase detection pixels that that sense incident light to detect phase information of the image; conversion circuitry operatively coupled to the pixel array to convert light incident on and passing through the image pixels and phase detection pixels into electrical pixel values; and a processor in communication with the conversion circuitry to process the electrical pixel values. The processor is configured to sum the electrical pixel values associated with each image sub-pixel array to produce an image value for each sub-pixel array; sum the electrical pixel values associated with each mixed sub-pixel array to produce a target value for each mixed sub-pixel array; generate a correction value based on the target value and image values from image sub-pixel arrays that surround each mixed sub-pixel array and have a similar color property to the mixed sub-pixel array the image sub-pixel arrays surrounds; and replace the target value with the correction value.

In one example aspect, the disclosed technology can be implemented to provide an image sensing device that includes: an image sensor including a first sub-pixel array including a plurality of first pixels having a first color filter and a second sub-pixel array including a plurality of second pixels having a second color filter and a plurality of third pixels for phase detection, and suitable for generating first pixel values from the first pixels, second pixel values from the second pixels and third pixel values from the third pixels; and an image processor suitable for generating a first image value corresponding to the first sub-pixel array based on the first pixel values and generating a second image value corresponding to the second sub-pixel array based on the first to third pixel values.

The first image value may be generated by combining the first pixel values, and the second image value may be generated by removing fourth pixel values estimated corresponding to the third pixel values based on the first pixel values from an image value obtained by combining the second pixel values and the third pixel values.

In another example aspect, the disclosed technology can be implemented to provide an image sensing device that includes: an image sensor including first and second unit pixel array of 4×4 pixel units and a third unit pixel array of a 4×4 pixel unit, and suitable for generating first pixel values from the first unit pixel array, second pixel values from the second unit pixel array and third pixel values from the third unit pixel array; and an image processor suitable for generating first image values corresponding to the first unit pixel array based on the first pixel values, generating second image values corresponding to the second unit pixel array based on the second pixel values, and generating third image values corresponding to the third unit pixel array based on some of the first pixel values, some of the second pixel values and the third pixel values, wherein each of the first and second unit pixel array includes image pixels arranged in a first color pattern, and the third unit pixel array includes image pixels and phase detection pixels arranged in a second color pattern.

The image processor may include: a combination block suitable for combining the first to third pixel values for each 2×2 pixel unit to generate the first to third image values; an extraction block suitable for extracting some of the first image values, some of the second image values and the third image values; a correction block suitable for generating a correction value corresponding to a target value among the third image values based on some of the first image values, some of the second image values and some of the third image values; and an image processing block suitable for replacing the target value among the third image values with the correction value.

In another example aspect, the disclosed technology can be implemented to provide an image sensing device that includes: a fifth sub-pixel array including one or more fifth image pixels having a second color filter and one or more phase detection pixels; a first sub-pixel array disposed adjacent to a top of the fifth sub-pixel array and including first image pixels, each having a first color filter; a second sub-pixel array disposed adjacent to a bottom of the fifth sub-pixel array and including second image pixels, each having the first color filter; a third sub-pixel array disposed adjacent to a left of the fifth sub-pixel array and including third image pixels, each having the first color filter; a fourth sub-pixel array disposed adjacent to a right of the fifth sub-pixel array and including fourth image pixels, each having the first color filter; and an image processor suitable for generating a first image value based on first pixel values generated from the first sub-pixel array, generating a second image value based on second pixel values generated from the second sub-pixel array, generating a third image value based on third pixel values generated from the third sub-pixel array, generating a fourth image value based on fourth pixel values generated from the fourth sub-pixel array, and generating a fifth image value based on the first to fourth image values and fifth pixel values generated from the fifth sub-pixel array.

Each of the phase detection pixels may have the first color filter.

The first color filter may include a green color filter, and the second color filter may include a blue color filter or a red color filter.

Those and other aspects, and their implementation examples of the disclosed technology are described in detail in the drawings, the description and the claims.

BRIEF DESCRIPTION OF THE DRAWINGS

FIG. 4 is a set of diagrams illustrating an example operation of the image processor shown in FIG. 3.

DETAILED DESCRIPTION

Figure 1:
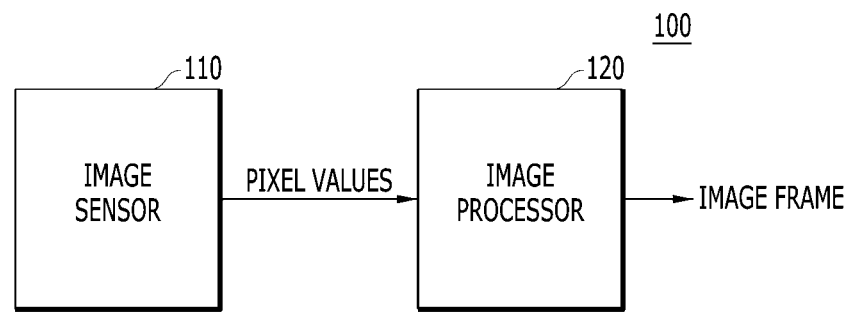
FIG. 1 is a block diagram illustrating an example of an image sensing device in accordance with an embodiment of the disclosed technology.

The disclosed image sensing technology can be implemented to provide an electronic device including an image sensing device to generate image values closer to an original image by compensating pixel values that deviate from the original image values due to phase detection pixels, which are used to gather phase information. The disclosed image sensor technology can be used to provide an image sensor array having both (1) imaging pixels for capturing incident light to capture or represent a subject or a scene as a color image and (2) phase difference detection pixels for detecting a phase of a captured image or scene to provide or facilitate auto-focusing and providing a three-dimensional representation of the captured image or scene. In some implementations of phase difference detection pixels, two different phase detection pixels can be paired to obtain signals that can be processed to measure the distance difference or the phase of a detected image for automatic focusing or 3D image rendition in optical imaging. Under this design, the imaging pixels and the phase difference detection pixels are spatially distributed in the same pixel array and, accordingly, due to the placement of the phase difference detection pixels amidst imaging pixels, in imaging construction of the entire pixel array, an interpolation process is performed to process or interpolate pixel signals from imaging pixels adjacent to a phase difference detection pixel to produce an interpolated imaging pixel signal value for the phase detection pixel. As a result, the pixel signals from imaging pixels and the interpolated imaging pixel signal values for phase difference detection pixels are combined to construct a captured image by the image sensor array.

The disclosed image sensor arrays can be based on various semiconductor sensor structures including, for example, a complementary metal oxide semiconductor (CMOS) image sensor or CIS. A CIS sensor can include an array of imaging pixels each including a photosensor that converts received light into electric charges, which may be a photogate, a photodiode, a phototransistor, a photoconductor, or a photosensitive structure capable of generating photo-generated charges. Each imaging pixel can also include a charge storage region for storing the photo-generated charges, which may be constructed as a floating diffusion region in some implementations. Additional circuitry may be included in each imaging pixel, e.g., a transfer transistor for transferring the photo-generated charges from the photosensor to the storage region and a reset circuitry for resetting the charges in the charge storage region after a readout.

In specific implementations, the disclosed technology based on having both imaging pixels and phase difference detection pixels in the same sensor array can be used to reduce or prevent undesired leakage of some of the light received at one of the phase difference detection pixels to one of the imaging pixels and that is adjacent to the phase difference detection pixel.

FIG. 1 is a block diagram illustrating an example of an image sensing device 100 in accordance with an embodiment of the disclosed technology.

Referring to FIG. 1, the image sensing device 100 may include an image sensor 110 and an image processor 120.

The image sensor 110 includes an array of imaging sensing pixels to generate pixel values corresponding to sensed images. The pixel values may indicate information that is collected by pixels of the image sensor 110 and constitutes an image captured by the pixels. For example, the pixel values may include electrical charge values that are converted from incident light received by the image sensor 110.

The image processor 120 may generate an image frame corresponding to the sensed images based on the pixel values. For example, incident light received by the image sensor 110 is converted into voltage or electrical current, and the image processor 120 generates the image frame based on the voltage or electrical current.

Figure 2:
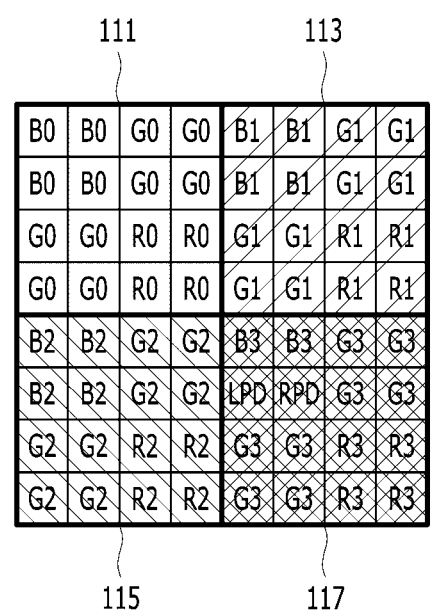
FIG. 2 is a diagram illustrating an example of a pixel array included in an image sensor shown in FIG. 1.

FIG. 2 is a diagram illustrating an example of a pixel array included in the image sensor 110 shown in FIG. 1. For convenience in description, FIG. 2 shows a portion of the pixel array. To capture colored images, the imaging sensing pixels are covered with respective color filters so that each imaging sensing pixel is designed to sense light at a particular designated color under its assigned color designation. Various color filter patterns may be used for coloring imaging and the Bayer color pattern is a commonly used color filter pattern which has 50% green pixels, 25% red pixels, and 25% blue pixels. The specific example in FIG. 2 shows a pixel arrangement of colored imaging pixels labeled as "R" for a red colored imaging pixel, "G" for a green colored imaging pixel, and "B" for a blue colored imaging pixel.

Referring to the specific example in FIG. 2, the sensing pixels in the pixel array of the image sensor 110 can be designed to as different color pixel groups called "unit pixel arrays" where the pixel s within each pixel group or unit pixel array are arranged based on the Bayer color pattern to have 50% green pixels, 25% red pixels, and 25% blue pixels. Specifically, the example in FIG. 2 shows four adjacent pixel groups of the image sensor 110 as first to third unit pixel arrays 111, 113 and 115, each including 4×4 pixels arranged in a first color pattern having 4 adjacent blue colored pixels, 4 adjacent red colored pixels and 8 green colored pixels in two diagonally arranged 4×4 regions, and a fourth unit pixel array 117 including 4×4 pixels arranged in a second color pattern containing two phase pixels LPD and RPD at two adjacent blue colored pixel locations.

The first unit pixel array 111 may include first to fourth sub-pixel arrays based on the Bayer color pattern, each including 2×2 pixels. Each of the first to fourth sub-pixel arrays may include first to fourth image pixels having the same color filter (e.g., green, blue or red).

For example, the first and second sub-pixel arrays may be arranged in a first diagonal direction, and the third and fourth sub-pixel arrays may be arranged in a second diagonal direction intersecting the first diagonal direction. Each of the first and second sub-pixel arrays may include the first to fourth image pixels with a green color G0 filter. The third sub-pixel array may include the first to fourth image pixels with a red color R0 filter, and the fourth sub-pixel array may include the first to fourth image pixels with a blue color B0 filter.

Since the second and third unit pixel arrays 113 and 115 are arranged in the same color pattern as the first unit pixel array 111, detailed descriptions thereof are omitted.

The fourth unit pixel array 117 may include fifth to eighth sub-pixel arrays, each including 2×2 pixels. Since the fifth to seventh sub-pixel arrays are arranged in the same color patterns as the first to third sub-pixel arrays, respectively, detailed descriptions thereof are omitted. The eighth sub-pixel array may include fifth and sixth image pixels with the same color pattern, and first and second phase detection pixels LPD and RPD for autofocus.

For example, as illustrated in FIG. 2, the fifth and sixth image pixels may be arranged along a top side of the eighth sub-pixel array, and the first (or left "L") and second (or right "R") phase detection pixels LPD and RPD may be arranged along a bottom side of the eighth sub-pixel array. Although it is illustrated in FIG. 2 that the fifth and sixth image pixels are arranged along the top side of the eighth sub-pixel array and the first and second phase detection pixels LPD and RPD are arranged along the bottom side of the eighth sub-pixel array, the fifth and sixth image pixels and the first and second phase detection pixels LPD and RPD may be arranged in a different manner. In another embodiment of the disclosed technology, the fifth and sixth image pixels may be arranged along the bottom side of the eighth sub-pixel array, and the first and second phase detection pixels LPD and RPD may be arranged along the top side of the eighth sub-pixel array. In another embodiment of the disclosed technology, the fifth and sixth image pixels may be arranged in the first diagonal direction, and the first and second phase detection pixels LPD and RPD may be arranged in the second diagonal direction intersecting the first diagonal direction in the eighth sub-pixel array. The fifth and sixth image pixels may have a blue color B3 filter. In an implementation of the disclosed technology, the first and second phase detection pixels LPD and RPD may have a green color filter.

Figure 3:
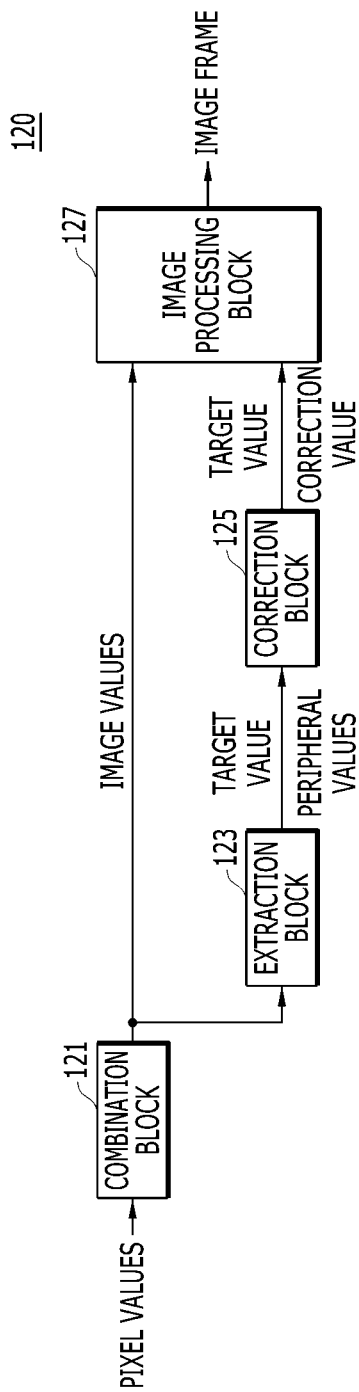
FIG. 3 is a block diagram illustrating an example of an image processor shown in FIG. 1.

FIG. 3 is a block diagram illustrating an example of the image processor 120 shown in FIG. 1. FIG. 4 is a set of diagrams illustrating an example operation of the image processor 120 shown in FIG. 3.

Referring to FIGS. 3 and 4, the image processor 120 may include a combination block 121, an extraction block 123, a correction block 125, and an image processing bock 127.

The combination block 121 may generate image values by sub-pixel array based on the pixel values generated by each sub-pixel array of the image sensor 110. In an implementation of the disclosed technology where a plurality of pixels of the image sensor 110 are grouped based on the color filter of the pixel, the image values may be formed by summing all of the electrical charge values generated by a group of pixels that have the same color filter. For example, the combination block 121 may combine the pixel values of the first sub-pixel array included in each of the first to third unit pixel arrays 111, 113 and 115 to generate image values G01, G03 and G21, and may combine the pixel values of the second sub-pixel array included in each of the first to third unit pixel arrays 111, 113 and 115 into image values G10, G12 and G30. The combination block 121 may also combine the pixel values of the third sub-pixel array included in each of the first to third unit pixel arrays 111, 113 and 115 into image values R11, R13 and R31, and may combine the pixel values of the fourth sub-pixel array included in each of the first to third unit pixel arrays 111, 113 and 115 into image values B00, B02 and B20. In addition, the combination block 121 may combine the pixel values of the fifth sub-pixel array included in the fourth unit pixel array 117 into an image value G23, and may combine the pixel values of the sixth sub-pixel array included in the fourth unit pixel array 117 into an image value G32. The combination block 121 may also combine the pixel values of the seventh sub-pixel array included in the fourth unit pixel array 117 into an image value R33, and may combine the pixel values of the eighth sub-pixel array included in the fourth unit pixel array 117 into an image value X. Hereinafter, the image value X is referred to as a "target value X."

Pixel values of the fifth and sixth image pixels and pixel values of the first and second phase detection pixels LPD and RPD may be included in the target value X. In one implementation of the disclosed technology, for example, phase detection pixels may form a mixed sub-pixel array together with normal image pixels (e.g., blue color), and as discussed above, the phase detection pixels may have the green color filter or may have a color property similar to the green color filter. Thus, the pixel values of the fifth and sixth image pixels may include pixel values obtained from incident light passing through the blue color B3 filter, and the pixel values of the first and second phase detection pixels LPD and RPD may include pixel values obtained from incident light passing through the green color filter. Accordingly, the target value X may include undesired pixel values, that is, the pixel values obtained from the phase detection pixels, for example, having the green color filter.

The extraction block 123 may extract, from the image values generated from the combination block 121, the target value X and the image values G12, G21, G23 and G32 of the sub-pixel arrays arranged on the periphery of the eighth sub-pixel array. In other words, the extraction block 123 may extract, from the image values generated from the combination block 121, the target value X obtained from the eighth sub-pixel array and the image values G12, G21, G23 and G32 obtained from the sub-pixel arrays adjacent to the eighth sub-pixel array, e.g., from the sub-pixel arrays that surround the eighth sub-pixel array. For example, the extraction block 123 may extract the image value G12 of the second sub-pixel array disposed adjacent to pixels at a top side of the eighth sub-pixel array among the first to fourth sub-pixel arrays included in the second unit pixel array 113, the image value G21 of the first sub-pixel array disposed adjacent to pixels at a left side of the eighth sub-pixel array among the first to fourth sub-pixel arrays included in the third unit pixel array 115, the image value G23 of the fifth sub-pixel array disposed adjacent to pixels at a right side of the eighth sub-pixel array among the fifth and sixth sub-pixel arrays included in the fourth unit pixel array 117, and the image value G32 of the sixth sub-pixel array disposed adjacent to pixels at a bottom side of the eighth sub-pixel array among the fifth and sixth sub-pixel arrays included in the fourth unit pixel array 117. Hereinafter, the image values G12, G21, G23 and G32 of the sub-pixel arrays arranged on the periphery of the eighth sub-pixel array are referred to as "peripheral values G12, G21, G23 and G32." Here, "peripheral values" may indicate image values from pixels in the immediate vicinity of a desired pixel.

The correction block 125 may generate a correction value based on the target value X and the peripheral values G12, G21, G23 and G32 to compensate for the pixel values of the phase detection pixels in the target value. For example, the correction block 125 may generate the correction value based on the following Equation 1.

$$X = V0 + V1 + VLPD + VRPD = V0 + V1 + X_G \quad \text{[Equation 1]}$$

$$X_G = \frac{VG_{avg}}{2 * \text{ratio}}$$

$$X_{comp} = 2(V0 + V1)$$
$$= 2(X - X_G)$$
$$= 2\left(X - \frac{VG_{avg}}{2 * \text{ratio}}\right)$$

Here, "X" refers to the target value (e.g., the image value of the eighth sub-pixel array as described above), "V0" and "V1" indicate pixel values from normal image pixels (i.e., pixels that are not phase detection pixels, e.g., referring to FIG. 4, "V0" refers to the pixel value of the fifth image pixel included in the eighth sub-pixel array, and "V1" refers to the pixel value of the sixth image pixel included in the eighth sub-pixel array), and "VLPD" and "VRPD" indicate pixel values from phase detection pixels (e.g., referring to FIG. 4, "VLPD" refers to the pixel value of the first phase detection pixel LPD included in the eighth sub-pixel array, and "VRPD" refers to the pixel value of the second phase detection pixel RPD included in the eighth sub-pixel array). "$X_G$" refers to a sum VLPD+VRPD of the pixel values of the first and second phase detection pixels LPD and RPD, and "$VG_{avg}$" refers to an average value of the image values except for a maximum value and a minimum value among the peripheral values G12, G21, G23 and G32. For example, if G12 and G21 are the maximum and minimum values, respectively, "$VG_{avg}$" may be obtained by dividing G23+G32 by two. In addition, "ratio" refers to a coefficient indicating a ratio between "VLPD", "VRPD" and the peripheral values G12, G21, G23 and G32, and "$X_{comp}$" refers to the correction value. For example, "ratio" may be obtained by dividing a value obtained based on one or more of the peripheral values G12, G21, G23 and G32 by an average value of "VLPD" and "VRPD". The value refers to an average value of the peripheral values G12, G21, G23 and G32, or refers to a median value of the peripheral values G12, G21, G23 and G32, or refers to any one of the peripheral values G12, G21, G23 and G32.

The correction block 125 may estimate the sum VLPD+VRPD of the pixel values of the first and second phase detection pixels LPD and RPD based on the peripheral values G12, G21, G23 and G32. For example, the correction block 125 may calculate the average value $VG_{avg}$ of the image values except for the maximum value and the minimum value among the peripheral values G12, G21, G23 and G32, and subsequently divide the average value $VG_{avg}$ by a predetermined coefficient 2*ratio, thereby estimating the sum VLPD+VRPD=$X_G$ of the pixel values of the first and second phase detection pixels LPD and RPD.

The correction block 125 may obtain the correction value $X_{comp}$ by subtracting the sum VLPD+VRPD=$X_G$ of the pixel values of the first and second phase detection pixels LPD and RPD from the target value X and then multiplying the result by two.

The image processing block 127 may generate the image frame corresponding to an original image based on the image values generated from the combination block 121 and the correction value $X_{comp}$ generated from the correction block 125. For example, the image processing block 127 may replace, among the image values generated from the combination block 121, the target value X with the correction value $X_{comp}$ to generate the image frame.

Various embodiments of the disclosed technology may obtain highly accurate image values by removing an undesired pixel value from image values.

Various embodiments of the disclosed technology may obtain image values closer to the original image by processing the image taken by an image pixel array including phase detection pixels such that pixel values generated from the phase detection pixels may be compensated.

An image sensing device implemented based on the disclosed technology may include a pixel array including a plurality of image sub-pixel array each of which includes only image pixels with the same color filter and a plurality of mixed sub-pixel array each of which include both the image pixels and phase detection pixels, conversion circuitry operatively coupled to the pixel array to convert light incident on and passing through the image pixels and phase detection pixels into electrical pixel values, and a processor in communication with the conversion circuitry.

The processor may process the electrical pixel values to sum the electrical pixel values associated with each image sub-pixel array to produce an image value for each sub-pixel array, sum the electrical pixel values associated with each mixed sub-pixel array to produce a target value for each mixed sub-pixel array, generate a correction value based on the target value and image values from image sub-pixel arrays that surround each mixed sub-pixel array and have a similar color property to the mixed sub-pixel array the image sub-pixel arrays surrounds, and replace the target value with the correction value. In an embodiment of the disclosed technology, the phase detection pixels can be arranged to have a similar color property to a green color filter, and the correction value may be generated based on the target value and image values from image sub-pixel arrays with the green color filter that surround each mixed sub-pixel array.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An image sensing device, comprising:
an image sensor including a first sub-pixel array and a second sub-pixel array, the first sub-pixel array including a plurality of first pixels each converting light into a pixel signal and including a first color filter to allow light of a first color to be received by each first pixel, the second sub-pixel array including both (1) a plurality of second pixels each converting light into a pixel signal and including a second, different color filter to allow light of a second color to be received by each second pixel, and (2) a plurality of third pixels that captures light for phase detection to provide image phase information, the image sensor generating first pixel values from the first pixels, second pixel values from the second pixels, and third pixel values from the third pixels; and
an image processor coupled to receive pixel signals from the imager sensor and structured to process the received pixel signals to generate a first image value corresponding to the first sub-pixel array based on the first pixel values and a second image value corresponding to the second sub-pixel array based on the first to third pixel values.

2. The image sensing device of claim 1, wherein the first image value is generated by combining the first pixel values, and the second image value is generated by removing fourth pixel values estimated based on the first pixel values to represent the third pixel values, from an image value obtained by combining the second pixel values and the third pixel values.

3. The image sensing device of claim 1, wherein each of the third pixels includes the first color filter.

4. The image sensing device of claim 3, wherein the first color filter includes a green color filter, and the second color filter includes a blue color filter or a red color filter.

5. The image sensing device of claim 1, wherein the first sub-pixel array and the second sub-pixel array are arranged adjacent to each other.

6. An image sensing device, comprising:
an image sensor including a first unit pixel array and a second unit pixel array of pixel units having only image pixels that sense incident light to generate imaging signals representing an image and a third unit pixel array of pixel units having both image pixels that sense incident light to generate imaging signals representing the image and phase detection pixels that sense incident light to detect phase information of the image, and suitable for generating first pixel values from the first unit pixel array, second pixel values from the second unit pixel array, and third pixel values from the third unit pixel array; and
an image processor coupled to receive pixel signals from the imager sensor and structured to process the received pixel signals to generate (1) first image values corresponding to the first unit pixel array based on the first pixel values, (2) second image values corresponding to the second unit pixel array based on the second pixel values, and (3) third image values corresponding to the third unit pixel array based on some of the first pixel values, some of the second pixel values, and the third pixel values,
wherein each of the first and second unit pixel array includes image pixels that arranged in a first color pattern that renders each image pixel to detect light of a first color, and the third unit pixel array includes image pixels and phase detection pixels arranged in a second color pattern that renders each image pixel to detect light of a second, different color.

7. The image sensing device of claim 6, wherein the image processor includes:
a combination block coupled and structured to combine the first to third pixel values from the pixel unit to generate the first to third image values;
an extraction block coupled to the combination block and structured to extract some of the first image values, some of the second image values, and the third image values;
a correction block coupled to the extraction block and structured to generate a correction value based on some of the first image values, some of the second image values and some of the third image values to compensate for the pixel values of the phase detection pixels in a target value obtained from the third image values; and
an image processing block coupled to the combination block and the correction block and structured to replace the target value with the correction value.

8. The image sensing device of claim 7, wherein the image processor is structured to include, in the target value, an image value obtained by combining pixel values generated from a sub-pixel array including the phase detection pixels.

9. The image sensing device of claim 7, wherein the correction block is structured to estimate a sum of pixel values of the phase detection pixels based on some of the first image values, some of the second image values, and some of the third image values, and obtains the correction value by subtracting the estimated sum from the target value.

10. The image sensing device of claim 6, wherein the image processor is structured to generate some of the first pixel values from the image pixels having a green color filter, some of the second pixel values from the image pixels having the green color filter, and each of the phase detection pixels has the green color filter.

11. The image sensing device of claim 6, wherein the first unit pixel array is disposed adjacent to either a top portion or a bottom portion of the third unit pixel array, and the second unit pixel array is disposed adjacent to either a left portion or a right portion of the third unit pixel array.

12. An image sensing device, comprising:
a fifth sub-pixel array including one or more fifth image pixels having a second color filter and one or more phase detection pixels;
a first sub-pixel array disposed adjacent to a top portion of the fifth sub-pixel array and including first image pixels, each having a first color filter;
a second sub-pixel array disposed adjacent to a bottom portion of the fifth sub-pixel array and including second image pixels, each having the first color filter;
a third sub-pixel array disposed adjacent to a left of the fifth sub-pixel array and including third image pixels, each having the first color filter;
a fourth sub-pixel array disposed adjacent to a right of the fifth sub-pixel array and including fourth image pixels, each having the first color filter; and
an image processor coupled to receive signals from the first, the second, the third, the fourth and the fifth sub-pixel arrays and structured to generate (1) a first image value based on first pixel values generated from the first sub-pixel array, (2) a second image value based on second pixel values generated from the second sub-pixel array, (3) a third image value based on third pixel values generated from the third sub-pixel array, (4) a fourth image value based on fourth pixel values generated from the fourth sub-pixel array, and (5) a fifth image value based on the first to fourth image values and fifth pixel values generated from the fifth sub-pixel array.

13. The image sensing device of claim 12, wherein each of the phase detection pixels has the first color filter.

14. The image sensing device of claim 12, wherein the first color filter includes a green color filter, and the second color filter includes a blue color filter or a red color filter.

15. The image sensing device of claim 12, wherein the image processor includes:
a combination block suitable for combining the first to fifth pixel values to generate the first to fifth image values;
an extraction block suitable for extracting the fifth image value as a target value and extracting the first to fourth image values as peripheral values;
a correction block suitable for generating a correction value based on the peripheral values to compensate for the pixel values of the phase detection pixels in the target value; and
an image processing block suitable for replacing the fifth image value with the correction value.

16. The image sensing device of claim 15, wherein the correction block estimates pixel values of the phase detection pixels based on the peripheral values and obtains the correction value by subtracting the estimated pixel values from the target value.

17. The image sensing device of claim 16, wherein the correction block estimates the pixel values of the phase detection pixels by calculating an average value of image values except for a maximum value and a minimum value among the peripheral values and dividing the average value by a predetermined coefficient.

* * * * *